United States Patent [19]

Egawa et al.

[11] Patent Number: 4,491,856
[45] Date of Patent: Jan. 1, 1985

[54] SEMICONDUCTOR DEVICE HAVING CONTACTING BUT ELECTRICALLY ISOLATED SEMICONDUCTOR REGION AND INTERCONNECTION LAYER OF DIFFERING CONDUCTIVITY TYPES

[75] Inventors: Hideharu Egawa, Tokyo; Yoshio Nishi; Kenji Maeguchi, both of Yokohama, all of Japan

[73] Assignee: Tokyo Shibaura Denki Kabushiki Kaisha, Kawasaki, Japan

[21] Appl. No.: 582,864

[22] Filed: Feb. 27, 1984

Related U.S. Application Data

[63] Continuation of Ser. No. 272,498, Jun. 11, 1981, abandoned.

[30] Foreign Application Priority Data

Jul. 15, 1980 [JP] Japan ................... 55-96752

[51] Int. Cl.³ .................. H01L 27/12; H01L 29/78; H01L 27/02; H01L 23/48
[52] U.S. Cl. .................................. 357/4; 357/41; 357/42; 357/59; 357/65; 357/68; 357/80; 357/23
[58] Field of Search .................. 357/4, 23 TF, 23 R, 357/41, 42, 59, 65, 68, 80

[56] References Cited

U.S. PATENT DOCUMENTS

| | | | |
|---|---|---|---|
| 3,080,441 | 3/1963 | Willandson et al. | 357/59 X |
| 3,271,632 | 9/1966 | Hartmann | 357/590 R |
| 3,460,006 | 8/1969 | Strull | 317/235 |
| 3,600,651 | 8/1971 | Duncan | 357/590 R |
| 3,979,230 | 9/1976 | Anthony et al. | 148/1.5 |
| 4,001,873 | 1/1977 | Kajiwara et al. | 357/590 R |
| 4,161,745 | 7/1979 | Slib | 357/68 |
| 4,191,964 | 3/1980 | Kant | 357/20 |
| 4,196,443 | 4/1980 | Dingwall | 357/4 X |
| 4,209,797 | 6/1980 | Egawa et al. | 357/59 X |

FOREIGN PATENT DOCUMENTS

2939290  4/1980  Fed. Rep. of Germany .

OTHER PUBLICATIONS

MOS–Technologien, Gerlach, Funkschau, 1975, No. 24, pp. 56–59.
MOS–Technologien, Gerlach, Funkschau, 1975, No. 25, pp. 58–62.
Nikkei Electronics, 1979, 7.23, pp. 110–132, and partial translation of p. 126.

Primary Examiner—Andrew J. James
Assistant Examiner—J. Carroll
Attorney, Agent, or Firm—Finnegan, Henderson, Farabow, Garrett & Dunner

[57] ABSTRACT

A semiconductor device includes p- and n-type semiconductor layers formed on an insulating substrate and an n-type interconnection layer formed to be electrically coupled with said n-type semiconductor layer. The n-type interconnection layer is formed in contact with the p-type semiconductor layer and is set at such a potential as to apply a reverse voltage across the p-n junction between the n-type interconnection layer and p-type semiconductor layer, so as to electrically isolate the n-type interconnection layer from the p-type semiconductor layer.

11 Claims, 25 Drawing Figures

SEMICONDUCTOR DEVICE HAVING CONTACTING BUT ELECTRICALLY ISOLATED SEMICONDUCTOR REGION AND INTERCONNECTION LAYER OF DIFFERING CONDUCTIVITY TYPES

This application is a continuation of application Ser. No. 272,498, filed June 11, 1981, now abandoned.

This invention relates to semiconductor devices.

Figure 1:
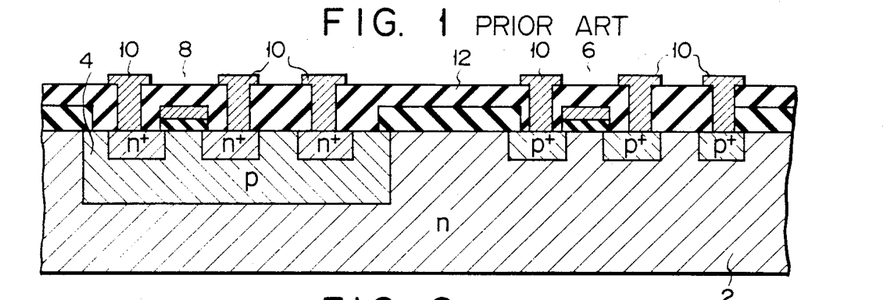
FIG. 1 is a schematic sectional view showing a prior art semiconductor device having an MOS structure.
Figure 2:
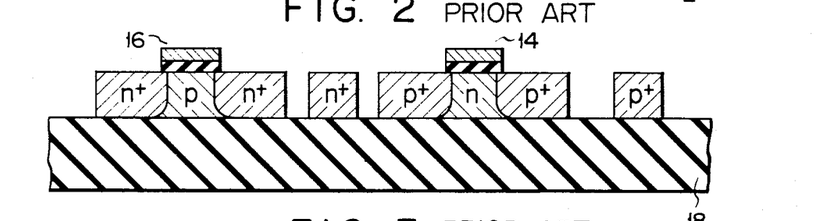
FIG. 2 is a schematic sectional view showing a prior art semiconductor device having a CMOS structure formed on a sapphire substrate.

With the recent trend for increasing the density and capacity of the large-scale integrated circuit (LSI), the increase of power consumption in the operation mode and standby mode has become a significant problem. For this reason, semiconductor devices which are mainly formed of complementary MOS inverters consuming comparatively low power have become more advantageous than the usual semiconductor devices mainly formed of enhancement-depletion type (E/D type) inverters. FIG. 1 shows a schematic sectional view of the construction of a usual complementary MOS device (CMOS device) formed on a silicon substrate. This CMOS device includes a combination of MOS transistors of different channels, namely p-channel and n-channel MOS transistors 6 and 8, and where an n-type semiconductor substrate 2 is used, for instance, these transistors are formed by forming a p-type well region 4 in a predetermined area of the semiconductor substrate, forming sources and drains in the surface regions of both the substrate 2 and p-type well region 4, and forming gate electrodes each insulatively connected between the source and drain of each pair. In this case, the electrodes 10 for the individual semiconductor regions are formed by selectively etching an insulating layer 12 formed substantially over the entire surface of the wafer and then depositing and selectively removing, for instance, aluminum. In this CMOS device, in order to prevent such a phenomena as give rise to mutual influence between the operations of both the MOS transistors, for instance a latch-up phenomenon, it is necessary to separate the two MOS transistors sufficiently far apart from each other, which makes it difficult to obtain a high density LSI. To solve this problem, CMOS devices have been developed using a silicon-on-sapphire (SOS) structure, as typically shown in FIG. 2, and having p-channel and n-channel MOS transistors 14 and 16 separately formed on an insulating substrate 18. With such a CMOS device of the SOS structure, the transistor 14 and 16 can be formed with a small space between them, so that the latch-up phenomenon will not occur, and it is possible to obtain comparatively great freedom of pattern design and form LSI of high density.

Figure 3:
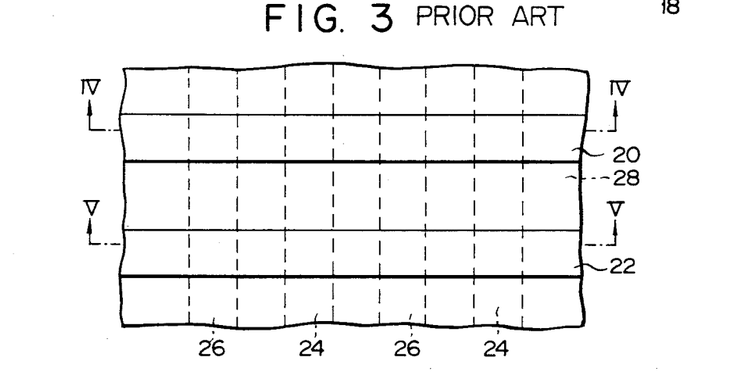
FIG. 3 is a schematic plan view of a prior art semiconductor device having semiconductor regions and interconnection layers formed on a sapphire substrate.
Figure 4:
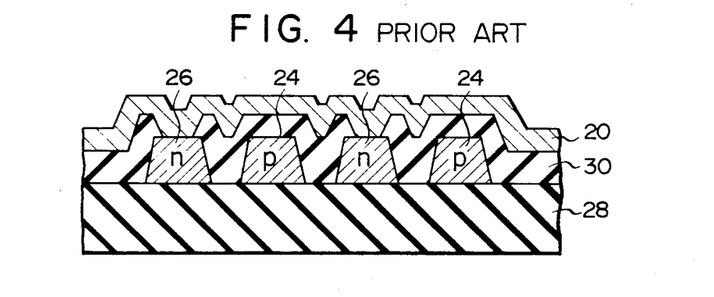
FIGS. 4 and 5 are schematic sectional views taken along lines IV—IV and V—V in FIG. 3 respectively.
Figure 5:
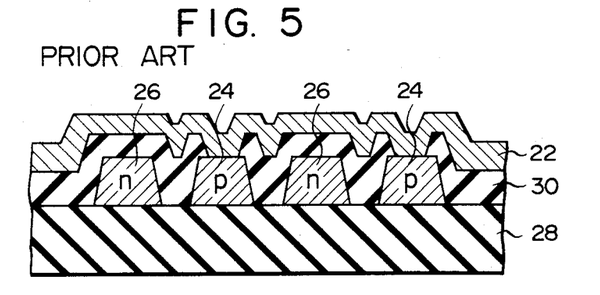

In the mean time, in order to increase the density of the LSI using the semiconductor device of the aforementioned type, it is required to electrically couple or separate interconnection layers with a comparatively high degree of freedom. FIGS. 3 to 5 show the interconnection of a prior art SOS structure semiconductor device. More particularly, FIG. 3 is a schematic plan view of a semiconductor device having aluminum layers 20 and 22 which are selectively connected to p-type and n-type semiconductor layers 24 and 26 formed on a sapphire substrate 28, and FIGS. 4 and 5 are sections taken along lines IV—IV and V—V in FIG. 3. This structure is obtained by forming an insulating layer 30 to cover p-type and n-type semiconductor layers 24 and 26 formed on an epitaxially grown sapphire substrate 28, forming contact holes through the insulating layer 30, and forming the interconnection layers 20 and 22 by depositing and selectively removing, for instance, aluminum. In this case, it is considerably troublesome to form the contact holes through the insulating layer 30. In addition, the interconnection layers 20 and 22 require considerably large areas, making it difficult to arrange them in desired positions and freely connect them to respective semiconductor regions. Therefore, it has been desired to connect the interconnection layers to respective semiconductor regions with a high-melting metal other than aluminum or a semiconductor layer.

The primary object of the invention is to provide a semiconductor device which is suitable for high density integration.

Another object of the invention is to provide a semiconductor device which permits individual interconnection layers to be easily separated from or connected to respective semiconductor regions with a high degree of freedom and also obtain multi-layer interconnection.

To achieve these objects, according to the invention there is provided a semiconductor device, which comprises a first semiconductor layer of first conductivity type; a second semiconductor layer of second conductivity type opposite to the first conductivity type; and an interconnection layer of the second conductivity type formed in contact with at least part of each of said first and second semiconductor layers and adapted to be set as a potential to apply a reverse voltage across a p-n junction formed between said first semiconductor layer and interconnection layer.

With the formation of an interconnection layer, for instance, of p-conductivity type in contact with p-type and n-type semiconductor regions, the p-type interconnection layer may be used as an interconnection layer only for the p-type semiconductor region by biasing the p-type interconnection layer to provide a reverse voltage across the juncture between the p-type interconnection layer and n-type semiconductor region. Thus, with this construction it is possible to form good contact regions without forming any contact hole and thus to obtain a multi-layer interconnection.

This invention can be more fully understood from the following detailed description when taken in conjunction with the accompanying drawings, in which.

Figure 6:
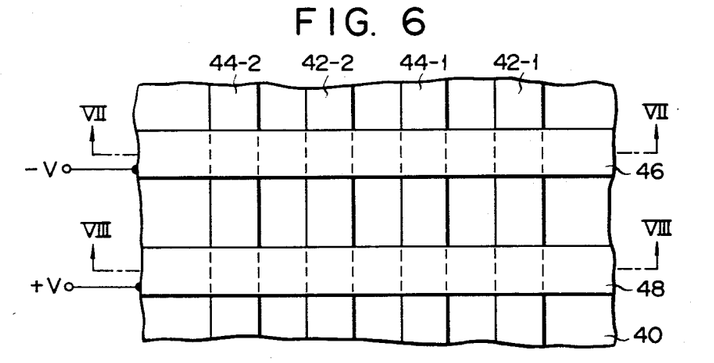
FIG. 6 is a schematic plan view showing one embodiment of a semiconductor device according to the invention, which includes semiconductor regions formed on a sapphire substrate and interconnection layers selectively electrically connected to the semiconductor regions.
Figure 7:
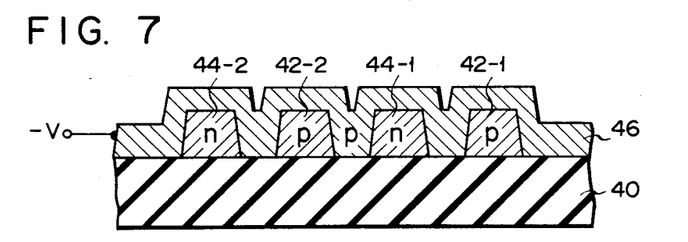
FIGS. 7 and 8 are schematic sectional views taken along lines VII—VII and VIII—VIII in FIG. 6.
Figure 8:
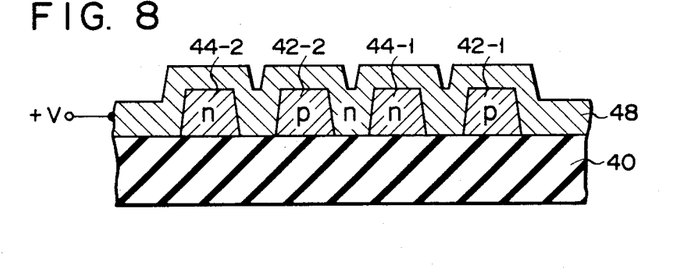

FIG. 6 is a schematic plan view showing one embodiment of the semiconductor device according to the invention, and FIGS. 7 and 8 show sections taken along lines VII—VII in FIG. 6. This semiconductor device includes a sapphire substrate 40, p-type epitaxial layers 42-1 and 42-2 and n-type epitaxial layers 44-1 and 44-2 formed in the alternate arrangement on the sapphire substrate 40 and p-type and n-type polycrystalline silicon interconnection layers 46 and 48 respectively formed in contact with and crossing epitaxial layers 42-1, 42-2, 44-1 and 44-2. It is to be noted that polycrystalline silicon interconnection layers 46, 48 are both formed in direct contact with the epitaxial layers 42-1, 42-2, 44-1 and 44-2. In the prior art structure, while the polycrystalline silicon layer and polycrystalline silicon interconnection layer which are of the same first conductivity type are formed in contact with each other for attaining their electric connection, the first conductivity type polycrystalline silicon layer is spaced apart from the second conductivity type epitaxial layer by an insulating layer for ensuring its insulation with respect to the second conductivity type epitaxial layer. In contrast, according to the invention, the epitaxial layer and polycrystalline silicon layer which are of different conductivity types are formed in contact with each other and are electrically insulated from each other by applying across the p-n junction therebetween a reverse voltage or a forward voltage which is not higher than the contact potential difference between the contacting n-type and p-type regions, for instance a voltage of 0.5 V or below. For example, in the semiconductor device shown in FIGS. 6 to 8, the p-type polycrystalline silicon layer 46 is connected to a negative supply voltage terminal −V, while the n-type polycrystalline silicon layer 48 is connected to a positive supply voltage terminal +V. Thus, while the p-type polycrystalline silicon layer 46 is electrically connected to the p-type epitaxial layers 42-1 and 42-2, it is electrically isolated from the n-type epitaxial layers 44-1 and 44-2 though it is in physical contact therewith. Also, while the n-type polycrystalline silicon layer 48 is electrically connected to the n-type epitaxial layers 44-1 and 44-2, it is electrically isolated from the p-type epitaxial layers 42-1 and 42-2 though it is in physical contact therewith.

Now, the method of manufacture of one embodiment of the semiconductor device according to the invention will be described with reference to FIGS. 9A through 9F.

Figure 9A:
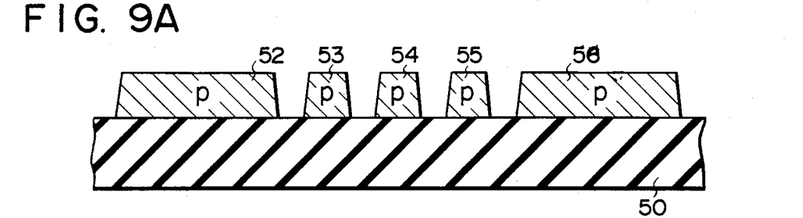
FIGS. 9A to 9F are schematic sectional views illustrating the process of manufacture of a different embodiment of a semiconductor device according to the invention.
Figure 9B:
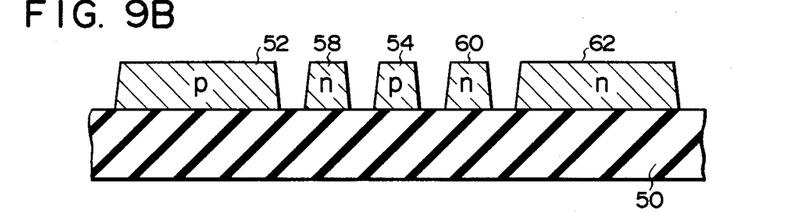

First, a p-type silicon layer having a crystal plane (100) is formed by the epitaxial growth method to a thickness of 0.6 $\beta$ on a sapphire substrate 50, and then it is selectively etched using, for instance, a mixture solution containing potassium hydroxide and isopropyl alcohol as etchant to leave desired silicon regions 52 to 56 in element formation regions as shown in FIG. 9A. Then, phosphorus is injected into the silicon regions 53, 55 and 56 by ion injection techniques to convert these regions into n-type silicon regions 58, 60 and 62 as shown in FIG. 9B. The semiconductor structure of FIG. 9B is then held in a dry $O_2$ atmosphere at 1,000° C. to form a silicon dioxide ($SiO_2$) film 1,000 Å thick, which is then selectively removed to leave portions on the silicon regions 52 and 56 over which gate electrodes are to be formed.

Figure 9C:
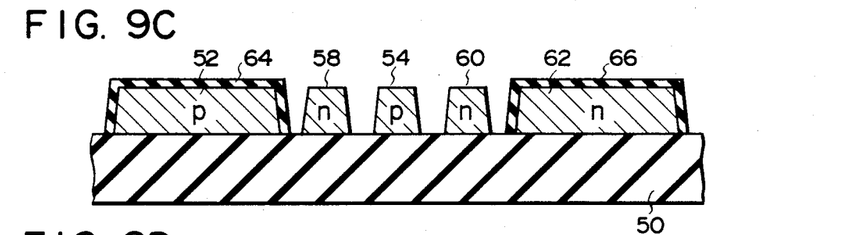
Figure 9D:
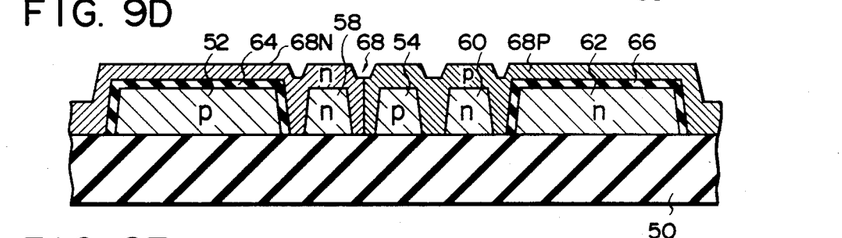
Figure 9E:
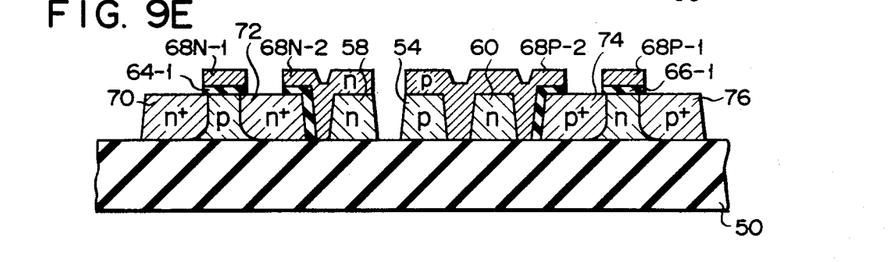
Figure 9F:
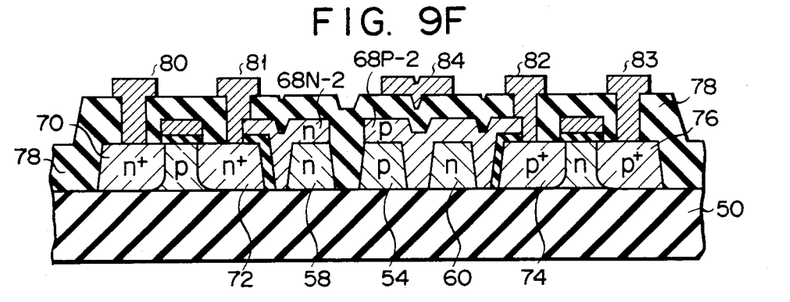

FIG. 9C shows the resultant structure with the $SiO_2$ films 64 and 66 formed on the respective p-type and n-type type regions 52 and 62. Subsequently, the semiconductor structure of FIG. 9C is covered by an undoped polycrystalline silicon layer 68 formed by the chemical vapor deposition (CVD) method to a thickness of 4,000 Å, and then phosphorus is injected by the ion injection method into a portion of the polycrystalline silicon layer 68 covering the $SiO_2$ film 64 and n-type silicon region 58 to form an n-type silicon layer 68N, while injecting boron by the ion injection method into a portion of the polycrystalline silicon layer 68 covering the p-type and n-type silicon regions 54 and 60 and $SiO_2$ film 66 to form a p-type silicon layer 68P, as shown in FIG. 9D. Thereafter, the p-type and n-type silicon layers 68P and 68N and $SiO_2$ films 64 and 66 are selectively etched, and then gate insulating layers 64-1 and 66-1 are formed. Gate electrodes 68N-1 and 68P-1 are formed on these insulating layers 64-1 and 66-1; an n-type conductive layer 68N-2 is formed on the n-type silicon layer 58; and a p-type conductive layer 68P-2 is formed on the p-type and n-type silicon regions 54 and 60 respectively, as shown in FIG. 9E. Afterwards, phosphorus is selectively injected into the p-type silicon region 52 to form $n^+$-type source and drain regions 70 and 72 respectively, and also into those portions (not shown) of the n-type interconnection layers 58 and 60 on which the respective conductive layers 68N-2 and 68P-2 are not formed, to reduce the resistance thereof. Also, boron is selectively injected into the n-type silicon region 62 to form $p^+$-type source and drain regions 74 and 76 respectively, and also into that portion (not shown) of the p-type layer 54 on which the p-type conductive layer is not formed, to reduce the resistance thereof. Thereafter, an $SiO_2$ film 78 is formed by the CVD method and selectively etched to form contact holes on the basis of the ordinary silicon gate process as shown in FIG. 9F. Then, aluminum is deposited on the resultant semiconductor structure, and the aluminum layer thus formed is selectively etched to form aluminum electrodes 80 to 83 selectively electrically connected to the semiconductor regions 70, 72 68N-2, 68P-

2, 74 and 76 and also form an aluminum layer 84 on the SiO$_2$ film 78. In step shown in FIG. 9D, it is possible to improve the ohmic contact between the n-type silicon region 58 and polycrystalline silicon layer 68N and between the p-type silicon region 54 and polycrystalline silicon layer 68P by injecting phosphorus into the n-type silicon regions 58 and 60 and boron into the p-type silicon region 54.

As has been shown, the first embodiment of the semiconductor device according to the invention can be manufactured by substantially the same method as the prior art method for manufacturing a usual semiconductor device having the SOS structure by forming a polycrystalline silicon interconnection layer, for instance the p-type conductive layer 68P-2, on and in direct contact with interconnection layers of different conductivity types, for instance the p-type and n-type silicon regions 54 and 60 respectively. In this case, since a negative voltage is applied to, for instance the p-type conductive layer 68P-2, a reverse voltage is applied across the junction between the p-type conductive layer 68P-2 and n-type silicon region 60 to electrically insulate the two from each other, while a negative voltage is applied to the p-type conductive layer 68P-2 via the p-type silicon region 54. It will be seen from FIG. 9F that with this semiconductor device a three-layer interconnection structure, for instance, constituted by the silicon region 60, p-type conductive layer 68P-2 and aluminum interconnection layer 84, can be obtained. Further, the electric contact respectively between the conductive layers 68P-2 and 68N-2 and the silicon regions 54 and 58 can be obtained without forming any contact hole as in the prior art by forming the conductive layers 68P-2 and 68N-2 in direct contact respectively with the silicon regions 54 and 58, so that a comparatively high degree of freedom for the interconnection can be obtained.

Figure 10:
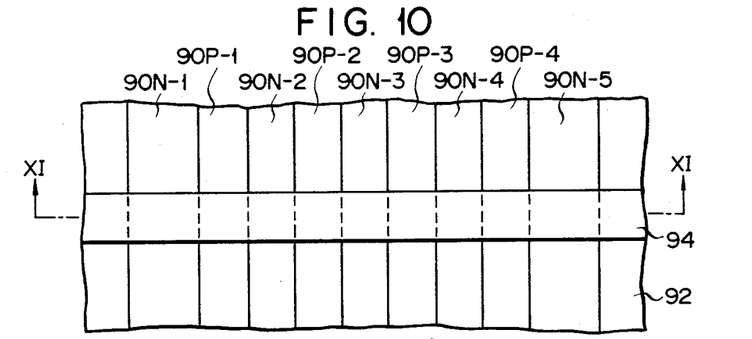
FIG. 10 is a schematic plan view showing a further embodiment of a semiconductor device according to the invention.
Figure 11:
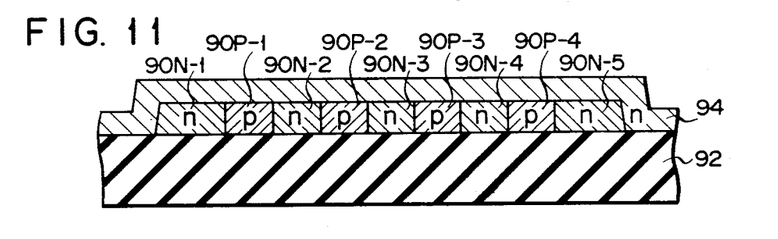
FIG. 11 is a schematic sectional view taken along line XI—XI in FIG. 10.

FIGS. 10 and 11 are respectively a schematic plan view and sectional view showing a different embodiment of the invention. This semiconductor device includes p-type epitaxial layers 90P-1 to 90P-4 n-type epitaxial layers and 90N-1 to 90N-5 formed alternately on a sapphire substrate 92 and in contact with one another as well as an n-type polycrystalline silicon layer 94 formed to cross these epitaxial layers. In this semiconductor device again, the n-type polycrystalline silicon layer 94 is biased by a voltage equal to or higher than the operation voltage impressed upon the p-type epitaxial layers 90P-1 to 90P-4 or such a voltage as to provide a forward voltage equal to or lower than the contact potential difference at the p-n junction between the n-type polycrystalline silicon layer 94 and p-type epitaxial layers 90P-1 to 90P-4. Thus, the n-type polycrystalline silicon layer 94 is electrically insulated from the p-type epitaxial layers 90P-1 to 90P-4. In this case, to the n-type epitaxial layers 90N-1 to 90N-5, the operation voltage is applied through the n-type polycrystalline silicon layer 94, so that these n-type epitaxial layers 90N-1 to 90N-5 are electrically separated from the p-type epitaxial layers 90P-1 to 90P-4 and these two different conductivity type layers will not have mutual influence upon one another in operation. Since with the semiconductor device of FIGS. 10 and 11 the p-type and n-type epitaxial layers 90P-1 to 90P-4 and 90N-1 to 90N-5 respectively are formed contiguous to one another, the manufacture LSI of increased density is enabled.

Figure 12:
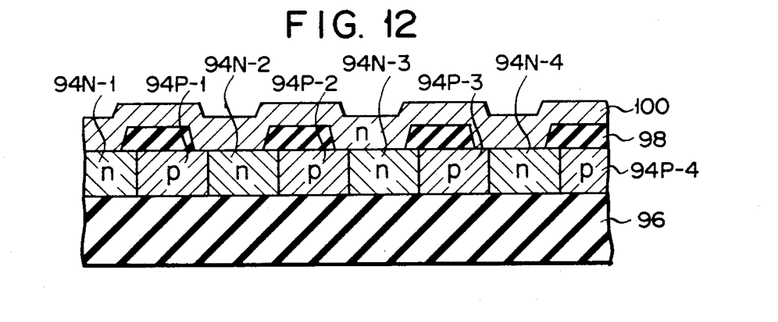
FIG. 12 is a schematic sectional view showing still another embodiment of a semiconductor device according to the invention.

FIG. 12 shows a sectional view of a semiconductor device including p-type and n-type epitaxial layers 94P-1 to 94P-4 respectively and 94N-1 to 94N-4 formed alternately on a sapphire substrate 96 and in contact with one another. Also, an insulating layer 98 which is formed on the p-type and n-type epitaxial layers 94P-1 to 94P-4 respectively and 94N-1 to 94N-4 is formed with contact holes, and an n-type polycrystalline silicon layer 100 is formed to be electrically connected to the n-type epitaxial layers 94N-1 to 94N-4 through these contact holes. Even if the contact holes are formed to also expose part of the p-type epitaxial layers 94P-1 to 94P-4 so that the n-type polycrystalline silicon layer 100 is partly in contact with the p-type epitaxial layers 94P-1 to 94P-4 producing p-n junctions therebetween, polycrystalline silicon layer 100 is biased by such a voltage that a reverse voltage or a forward voltage not higher than the contact potential difference across the p-n junction between the p-type and n-type epitaxial layers 94P-1 to 94P-4 respectively is applied across the p-n junction. As a result n-type polycrystalline silicon layer 100 is electrically insulated from the p-type epitaxial layers 94P-1 to 94P-4. Thus, no precise control of positioning is necessary at the time of the formation of the contact holes, and also there is no need of taking the positioning errors into consideration. Thus, the manufacture can be simplified, and also it is possible to increase the density of integration.

Figure 13:
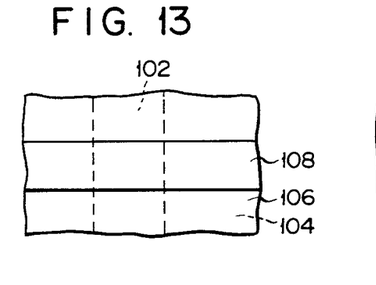
FIGS. 13 and 14 are respectively schematic plan and sectional views showing a further embodiment of a semiconductor device according to the invention, which includes a semiconductor region formed in a semiconductor substrate and an interconnection layer of a different conductivity type from that of the semiconductor region.
Figure 14:
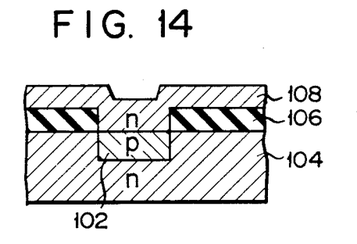

FIGS. 13 and 14 are respectively schematic plan and sectional views showing an embodiment of the invention using a semiconductor substrate. This semiconductor device includes a p-type region 102 formed on a surface region of an n-type semiconductor substrate 104, an insulating layer 106 formed to cover the semiconductor substrate 104 except for a region where the p-type region 102 is formed, and an n-type polycrystalline interconnection layer 108 formed to cross and contact the p-type region 102. Again in this case, the n-type interconnection layer 108 is biased by such a voltage that a reverse voltage or a forward voltage not higher than the contact potential difference at the p-n junction between the p-type and n-type regions 102 and 108 respectively is applied across the p-n junction. Thus, the n-type interconnection layer 108 is electrically insulated from the p-type region 102. With this arrangement, it is possible to dispense with the insulating film that has hitherto been required between the p-type and n-type regions 102 and 108 respectively and also to form the p-type and n-type regions 102 and 108 respectively such that they cross each other in a desired positional relation, thus permitting the simplification of the manufacturing process and the increase of the integration density.

Figure 15:
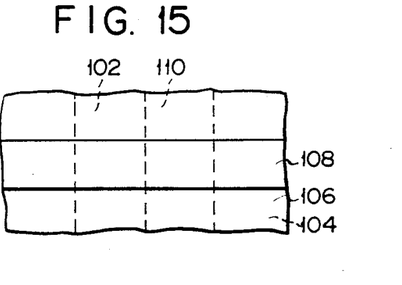
FIGS. 15 and 16 are respectively schematic plan and sectional views showing a further embodiment of a semiconductor device according to the invention, which includes semiconductor regions of different conductivity types formed on a semiconductor substrate and in contact with each other.
Figure 16:
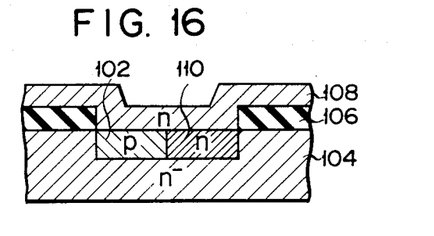

FIGS. 15 and 16 are respectively schematic plan and sectional views of a further embodiment of the semiconductor device according to the invention. This semiconductor device is the same as the semiconductor device of FIGS. 13 and 14, except that an n-type region 110 is formed in contact with the p-type region 102. In this case, the n-type polycrystalline interconnection layer 108 is electrically insulated from the p-type region 102, while it is electrically coupled to then-type region 110.

Figure 17:
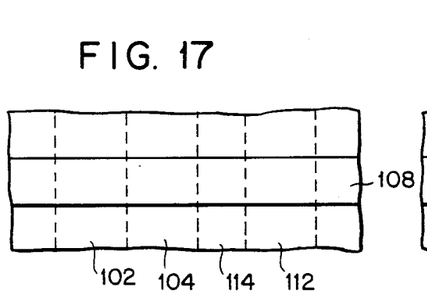
FIGS. 17 and 18 are respectively schematic plan and sectional views showing a further embodiment of the semiconductor device according to the invention, which includes spaced apart semiconductor regions of different conductivity types and an interconnection layer.
Figure 18:
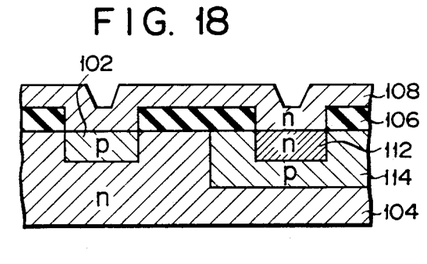

FIGS. 17 and 18 are respectively schematic plan and sectional views of a further embodiment of the semiconductor device according to the invention. This semiconductor device is the same as the semiconductor device of FIGS. 13 and 14, except that an n-type region 112 is formed in the surface region of a p-type well region 114 formed in a spaced apart relation to the p-type region 102. In this case, the n-type polycrystalline interconnection layer 108 is electrically isolated from the p-type region 102, while it is electrically coupled to the n-type region 112.

Figure 19:
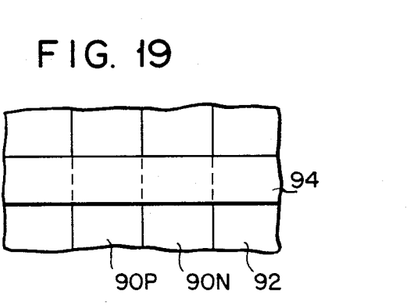
FIGS. 19 and 20 are respectively schematic plan and sectional views showing a modification of the semiconductor device shown in FIGS. 10 and 11.
Figure 20:
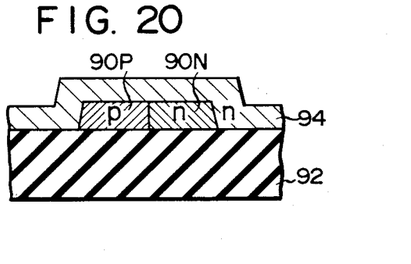

FIGS. 19 and 20 show a modification of the semiconductor device shown in FIGS. 10 and 11. This semiconductor device includes p-type and n-type epitaxial layers 90P and 90N respectively formed on a sapphire substrate 92 and an n-type polycrystalline silicon layer 94 formed on and in contact with the epitaxial layers 90P and 90N. The polycrystalline silicon layer 94 is biased by such a voltage that a reverse voltage or a forward voltage not higher than the contact potential difference at the p-n junction between the polycrystalline silicon layer 94 and epitaxial layer 90P is applied across the p-n junction, and the polycrystalline silicon layer 94 is electrically insulated from the p-type epitaxial layer 90P while it is thus electrically coupled to the n-type epitaxial layer 90N. Of course the p-type and n-type epitaxial layers 90P and 90N respectively are electrically insulated from each other and have no mutual influence upon each other, as a reverse voltage or a forward voltage not higher than the contact potential difference at the p-n junction between them is applied across that p-n junction.

While some preferred embodiments of the invention have been described in the foregoing, they are by no means limitative. For example, it is possible to reverse the conductivity types of the semiconductor layers, regions and substrate used in the above embodiments. Also, while in the above embodiments a polycrystalline silicon layer has been formed on and in contact with monocrystalline silicon regions, it is possible to use a monocrystalline silicon layer in lieu of the polycrystalline silicon layer or to use polycrystalline silicon regions in lieu of the monocrystalline silicon regions. Further, while in some of the above embodiments a sapphire substrate has been used as the insulating substrate, it may be replaced with any other substrate or layer which has the insulating property in effect.

Further, while in the embodiment of FIGS. 6 to 8 the p-type and n-type polycrystalline silicon layers 46 and 48 respectively have been formed in a spaced-apart relation to each other, they may be formed at least partly in contact with each other as well. Further, either the positive or negative supply voltage terminal +V or −V used in this embodiment may be replaced with a ground terminal.

Further, throughout the specification, the terms "lower" and "higher" are used with respect the potential in a mathematical sense. That is, it is to be understood that OV is higher than any negative potential and lower than any positive potential.

What we claim is:

1. A semiconductor device comprising:
   a. an insulating body;
   b. a first semiconductor layer of first conductivity type formed on said insulating body;
   c. a second semiconductor layer of second conductivity type opposite to the first conductivity type formed on said insulating body;
   d. an interconnection layer of the second conductivity type formed in contact with at least the top surface of each of said first and second semiconductor layers; and
   e. voltage means for applying a reverse bias voltage across a p-n junction formed between said first semiconductor layer and said interconnection layer for electrically isolating said first semiconductor layer and said interconnection layer from each other and electrically coupling said second semiconductor layer and said interconnection layer to each other.

2. A semiconductor device according to claim 1, wherein said interconnection layer is formed of polycrystalline silicon.

3. A semiconductor device comprising:
   a. an insulating body;
   b. a first semiconductor layer of first conductivity type formed on said insulating body;
   c. a second semiconductor layer of second conductivity type opposite to the first conductivity type formed on said insulating body;
   d. an interconnection layer formed in contact with at least the top surface of each of said first and second semiconductor layers; and
   e. voltage means for applying a bias voltage across a p-n junction formed between said first semiconductor layer and said interconnection layer which is not higher than the contact potential difference at said p-n junction.

4. A semiconductor device according to claim 3, wherein said interconnection layer is formed of polycrystalline silicon.

5. A semiconductor device comprising:
   a. an insulating body formed of substantially insulative material;
   b. first and second semiconductor layers of first and second conductivity types respectively formed on said insulating body and in contact with each other to form a p-n junction therebetween;
   c. voltage means for applying a reverse bias voltage across said p-n junction;
   d. a first interconnection layer of the second conductivity type formed in contact with at least the top surface of each of said first and second semiconductor layers; and
   e. voltage means for applying a reverse bias voltage across a p-n junction formed between said first semiconductor layer and said first interconnection layer for electrically isolating said first semiconductor layer and said interconnection layer from each other and electrically coupling said second semiconductor layer and said interconnection layer to each other.

6. A semiconductor device according to claim 5, which further comprises a second interconnection layer of the first conductivity type formed in contact with at least part of said first and second semiconductor layers, and voltage means for applying a reverse bias voltage across a p-n junction formed between said second semiconductor layer and said second interconnection layer.

7. A semiconductor device according to claim 6, wherein said first and second interconnection layers are formed of polycrystalline silicon.

8. A semiconductor device comprising:
   a. an insulating body formed of substantially insulative material;
   b. first and second semiconductor layers of first and second conductivity types respectively formed on said insulating body and in contact with each other to form a first p-n junction therebetween;
   c. voltage means for applying a bias voltage not higher than the contact potential difference at said first p-n junction across said first p-n junction;
   d. a first interconnection layer of the second conductivity type formed in contact with at least the top surface of each of said first and second semiconductor layers; and e. voltage means for applying a bias voltage across a second p-n junction between said first semiconductor layer and said first interconnection layer which is not higher than the contact potential difference at said second p-n junction.

9. A semiconductor device according to claim 8, which further comprises a second interconnection layer of the first conductivity type formed in contact with at least part of said first and second semiconductor layers, and voltage means for applying a bias voltage across a third p-n junction between said second semiconductor layer and said second interconnection layer which is not higher than the contact potential difference at said third p-n junction.

10. A semiconductor device according to claim 9, wherein said first and second interconnection layers are formed of polycrystalline silicon.

11. A semiconductor device according to claim 8, wherein said first and second interconnection layers are formed of polycrystalline silicon.

* * * * *